United States Patent
Funakawa

[11] Patent Number: 6,047,008
[45] Date of Patent: Apr. 4, 2000

[54] VARIABLE WAVELENGTH LASER LIGHT SOURCE

[75] Inventor: Seiji Funakawa, Tokyo, Japan

[73] Assignee: Ando Electric Co., Ltd., Tokyo, Japan

[21] Appl. No.: 09/200,506

[22] Filed: Nov. 25, 1998

[30] Foreign Application Priority Data

Nov. 28, 1997 [JP] Japan .................... 9-329344

[51] Int. Cl.[7] .................................................. H01S 3/10
[52] U.S. Cl. .......................... 372/20; 372/98; 372/102; 372/107
[58] Field of Search ................... 372/20, 29, 98, 372/102, 107; 350/162

[56] References Cited

U.S. PATENT DOCUMENTS

| | | | |
|---|---|---|---|
| 3,603,690 | 9/1971 | Hard | 350/162 |
| 4,229,710 | 10/1980 | Shoshan | 372/20 |
| 5,347,527 | 9/1994 | Favre et al. | 372/20 |
| 5,491,714 | 2/1996 | Kitamura | 372/102 |
| 5,493,575 | 2/1996 | Kitamura | 372/20 |
| 5,802,085 | 9/1998 | Lefevre et al. | 372/20 |
| 5,862,162 | 1/1999 | Maeda | 372/20 |
| 5,982,794 | 11/1999 | Tamura | 372/32 |

FOREIGN PATENT DOCUMENTS

| | | |
|---|---|---|
| 0 702 438 | 3/1996 | European Pat. Off. . |
| 296 07 659 U | 8/1996 | Germany . |
| 4-262588 | 9/1992 | Japan . |
| 5-267768 | 10/1993 | Japan . |

OTHER PUBLICATIONS

Favre, F., et al.,Electronic Letters, 22:795, 1986.

Primary Examiner—Leon Scott, Jr.
Attorney, Agent, or Firm—Darby & Darby

[57] ABSTRACT

A variable wavelength laser light source to improve the resolution of the outgoing light and output only pure laser light without the natural emitted light has an optical amplification element (laser) 11, a first optical reflector 12 at one end surface 11a of the optical amplification element 11, and a wavelength selection element (diffraction grating) 13 at the other end surface 11b of the optical amplification element 11 which selects and outputs the desired wavelength light emitted by the optical amplification element 11. A second optical reflector 14 receives the outgoing light from the wavelength selection element 13 to form the optical resonator with the first optical reflector 12. A first rotating mechanism 15 rotates the second optical reflector 14 around its axis, and a second rotating mechanism 16 connected to the first rotating mechanism 15 rotates the second optical reflector 14 around a second axis 16a remote from the second optical reflector 14 by rotating the first rotating mechanism.

8 Claims, 6 Drawing Sheets

VARIABLE WAVELENGTH LASER LIGHT SOURCE

BACKGROUND OF THE INVENTION

1. Field of the Invention

The present invention relates to a variable wavelength laser light source which is capable of changing its wavelength without mode hopping, and to produce the light with a high resolution of the wavelength by eliminating the spontaneously emitted light.

This application is based on patent application No. Hei 09-329344 filed in Japan, the content of which is incorporated herein by reference.

2. Description of Related Art

A conventional example of the prior art, which is shown in FIG. 5, will be explained below. In FIG. 5, a semiconductor laser 1 with two faces 1a, 1b is provided. The face 1a is a reflecting face and the other face 1b has a non-reflection film on its surface. Diffraction grating 2 is located to one side of face 1b, and collimator lens 7 is between the face 1b and the diffraction grating 2. Total reflection mirror 3 is provided perpendicularly to the outgoing light of the desired wavelength which is diffracted by the diffraction grating 2, and reflects the diffracted light back to the diffraction grating 2. Supporting bar 5 connects the total reflection mirror 3 and rotating mechanism 4. Condenser lens 8 is provided between the semiconductor laser 1 and an optical fiber 6, and the optical fiber 6 is located over the face 1a of the semiconductor laser 1. Collimator lens 7 is also provided between the semiconductor laser 1 and the diffraction lens 2.

Point A is an intersection of the optical axis Ax and the diffraction face 2a. Virtual reflection face 9 is located at a distance from the point A toward the face 1a which depends on the refractive index n1 of semiconductor laser 1 and n2 of the collimator lens 7.

A line extended through the virtual reflection face 9 and a line extended through the diffraction face 2a intersect at the central axis C of the rotating mechanism 4.

Also, point B is the intersection of diffracted light emitted from the diffraction grating 2 and the total reflection mirror 3. $\alpha$ is the incident angle of the laser light emitted by the semiconductor laser 1, at the diffraction face 2a. $\beta$ is the output angle of the laser light emitted from the diffraction face 2a to the reflection face 3a of the total reflection mirror 3.

The physical length L from the point A to the face 1a is calculated by the formula (1); L1 is the distance between the point A and the face 1b, L2 is the length of a resonator in the semiconductor laser 1.

$$L = L1 + L2 \quad (1)$$

Also, the distance L' from the point A to the virtual reflection face 9 is calculated by the formula (2); L3 is a thickness of the collimator lens 7.

$$L' = (L1-L3) + L2 \times n1 + L3 \times n2 \quad (2)$$

In the formula (2), n1 is the refractive index of the semiconductor laser 1, and n2 that of the collimator lens 7.

Laser oscillation is performed by an optical oscillator composed by the face 1a and the total reflection mirror 3, and the semiconductor laser 1 which amplifies the light. Wavelength of the oscillated laser light is calculated by the formula (3).

$$\text{SIN } \alpha + \text{SIN } \beta = m \times N \times \lambda \quad (3)$$

In the formula (3), m is the diffraction order at the diffraction grating 2 and N is the number of grooves per unit of length of the diffraction grating 2.

The total reflection mirror 3 is connected to the rotating mechanism 4 by the supporting bar 5. By rotating the rotating mechanism 4 around the central axis, the angle of the diffracted light D changes; D is incident perpendicularly to the reflection face 3a from the diffraction grating 2. For that reason, wavelength $\lambda$ of the oscillated laser light changes.

As explained above, by rotating the rotating mechanism 4, the position of the reflection face 3a changes, and consequently the wavelength $\lambda$ of the oscillated laser light emitted by the light source with variable wavelength can be changed.

Further, the light source with variable wavelength explained above has no mode-hopping when changing the wavelength $\lambda$ of oscillation, because the oscillation is performed under the condition that the longitudinal mode of the laser light is always constant. The method used in the above light source is the well-known SIN bar method.

There is a problem in the conventional light source with variable wavelength that the rotating mechanism 4 becomes very complicated and expensive when a light source with high resolution is desired and a rotating mechanism with high speed and high resolution is required, because high rotating resolution of the rotating mechanism is required when high resolution of the wavelength is needed, in the conventional light source with variable wavelength.

Another problem in the above conventional light source with variable wavelength is that, as shown in the FIG. 6, the accuracy of the output wavelength is degraded because the laser light with a wavelength selected by the diffraction grating 2 and spontaneously emitted light 10b from the semiconductor laser 1 are simultaneously output.

SUMMARY OF THE INVENTION

It is therefore an object of the present invention to provide a light source with variable wavelength which is capable of producing laser light with high resolution without a rotating mechanism with high speed and high resolution, and to output the laser light with a wavelength of high accuracy by eliminating the spontaneously emitted light.

In order to attain this object, the present invention provides a variable wavelength laser light source comprising an optical amplification element; a first optical reflection means which is located to one side of an output face of the optical amplification element; a wavelength selection element which is located to one side of the other face of the amplification element, and selects and outputs light of the desired wavelength emitted from said optical amplification element; a second optical reflection means which reflects the emitted light from said wavelength selection element, and forms the optical resonator with said first optical reflection means; a first rotating mechanism which rotates said second optical reflection means around the center axis of said first rotating mechanism; and a second rotating mechanism which rotates said second optical reflection means around the second axis provided outside of said second optical reflection means.

With the variable wavelength laser light source of the present invention, it is possible to control the position and the angle of the reflecting surface of the second optical reflection means with high accuracy, by means of the two rotating mechanisms connected to the second optical reflection means: the first rotating mechanism which rotates the second optical reflection means around its axis, and the second rotating mechanism which rotates the second optical reflection means around the second axis which is out of the second optical reflection means.

Furthermore, with the variable wavelength laser light source of the present invention, it is also possible to stabilize the relative position of the optical axis on the reflecting surface of the second optical reflecting means, and consequently possible to produce amplified light with high wavelength resolution by eliminating the spontaneously emitted light, because the first and the second rotating mechanisms control the position and the angle of the reflection surface of the second optical reflection means.

DESCRIPTION OF PREFERRED EMBODIMENTS

A. First Embodiment

Figure 1:
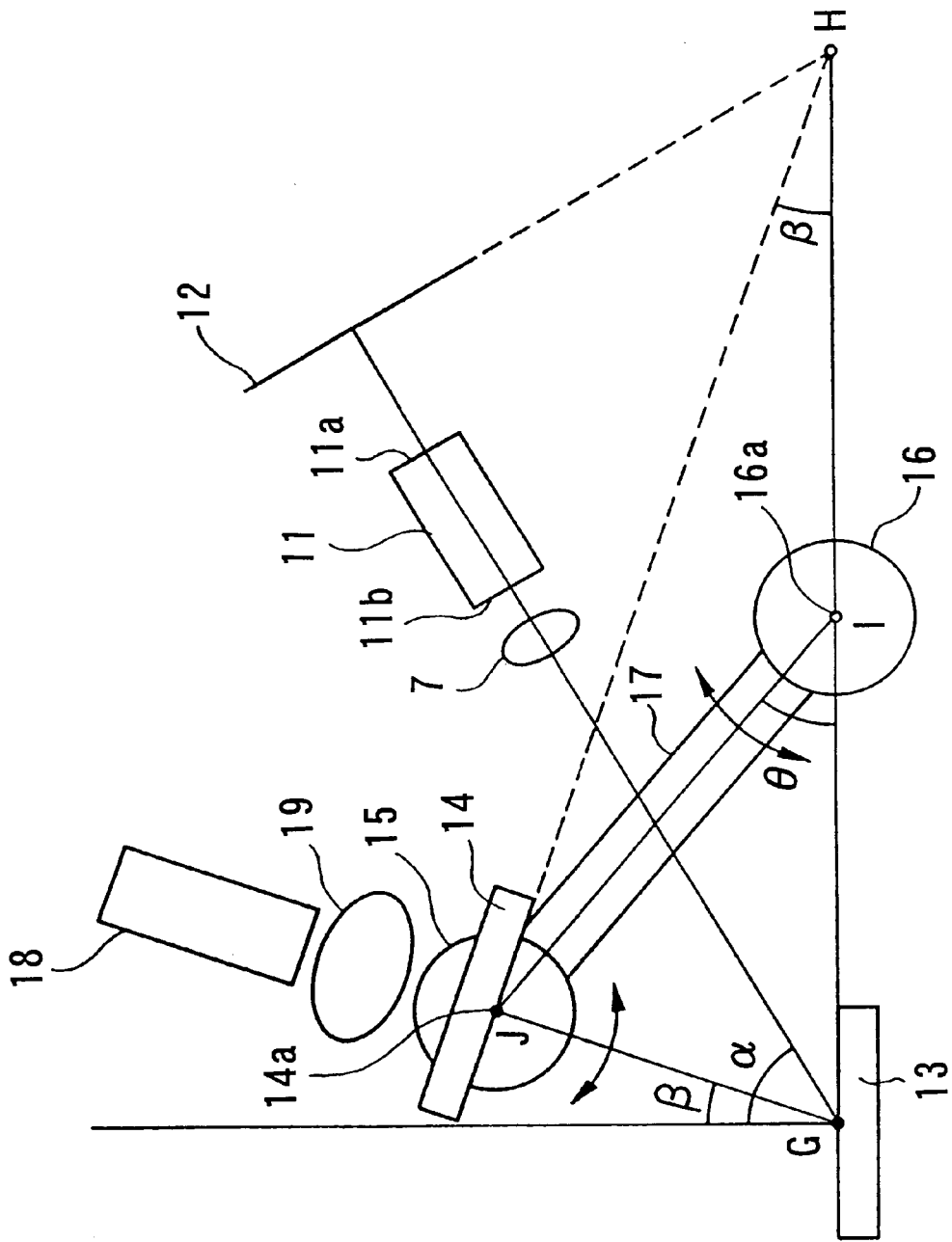
FIG. 1 is a diagram illustrating the variable wavelength laser light source according to the first embodiment of the present invention.

A variable wavelength laser light source according to a first embodiment of the present invention will be described below with reference to FIG. 1, which is a block diagram illustrating a variable wavelength laser light source. In FIG. 1, reference number 11 is an optical amplification element. Reference number 12 is a first optical reflecting means which is located over the end surface 11a of the optical amplification element 11. Reference number 13 is a wavelength selection means which is located over an end surface 11b of the optical amplification element 11, and selects light with the desired wavelength from the outgoing light of the optical amplification element 11 and output it. Reference number 14 is a second optical reflection means which reflects the outgoing light from the wavelength selection means 13, and constitutes an optical resonator with the first optical reflecting means 12.

Also, a connecting means 17 connects a first rotating mechanism 15 which rotates the second optical reflection means 14 around its axis 14a, and a second rotating mechanism 16 which rotates the second optical reflection means 14 around rotating axis (second axis) 16a and moves the position of the optical reflection means 14. Reference number 18 is an optical transmission line and reference number 19 is an optical connecting means which inputs the transparent light, which is emitted by the second optical reflection means 14, to the optical transmission line 18.

Point G is an intersection of the optical axis of output light from the optical amplification element 11 and outgoing surface of the wavelength selection element 13. Point H is an intersection of the extension of the reflecting surface of the first reflecting means 12 and the extension of the outgoing surface of the wavelength selection means 13. Point I is a middle point between point G and point H. Angle α is the angle made by the normal line of the outgoing surface of the wavelength selection element 13 and the optical axis of the outgoing light from the optical amplification element 11. Angle β is the angle made by the normal line of the outgoing surface of the wavelength selection element 13 and the optical axis of the reflecting light from the optical reflecting means 14.

The rotating axis 14a of the first rotating mechanism 15 is on the point J, and the second optical reflecting means 14 rotates around the point J. The rotating axis 16a of the second rotating mechanism 16 is on the point I, and the second optical reflecting means 14 rotates on the circumference of the circle centered on point J.

Hereby, the length of straight line IJ is same as the length of the straight line HI, and the angle made by the line GH and line JH is β.

The variable wavelength laser light source of this first embodiment performs laser oscillation with an optical resonator constituted by the first optical reflecting means 12 and the second optical reflecting means 14, and the optical amplification element 11.

The wavelength λ of the oscillation of the laser light is determined by the angle α and the angle β, shown by the above formula (3). Also, the first rotating mechanism 15 rotates so that the line extended along the reflecting surface of the second optical reflecting means 14 passes through the point H, when the second rotating mechanism 16 rotates around the rotating axis 16a. In other words, as the angle β changes, the wavelength of the laser light λ produced by the present embodiment changes.

Here, the relation between the angle θ and the angle β is shown by the formula (4) below; the angle θ is a rotating angle of the second rotating mechanism 16, also is an angle made by the straight line GH and the straight line JI.

$$\theta = 2\beta \quad (4)$$

Figure 5:
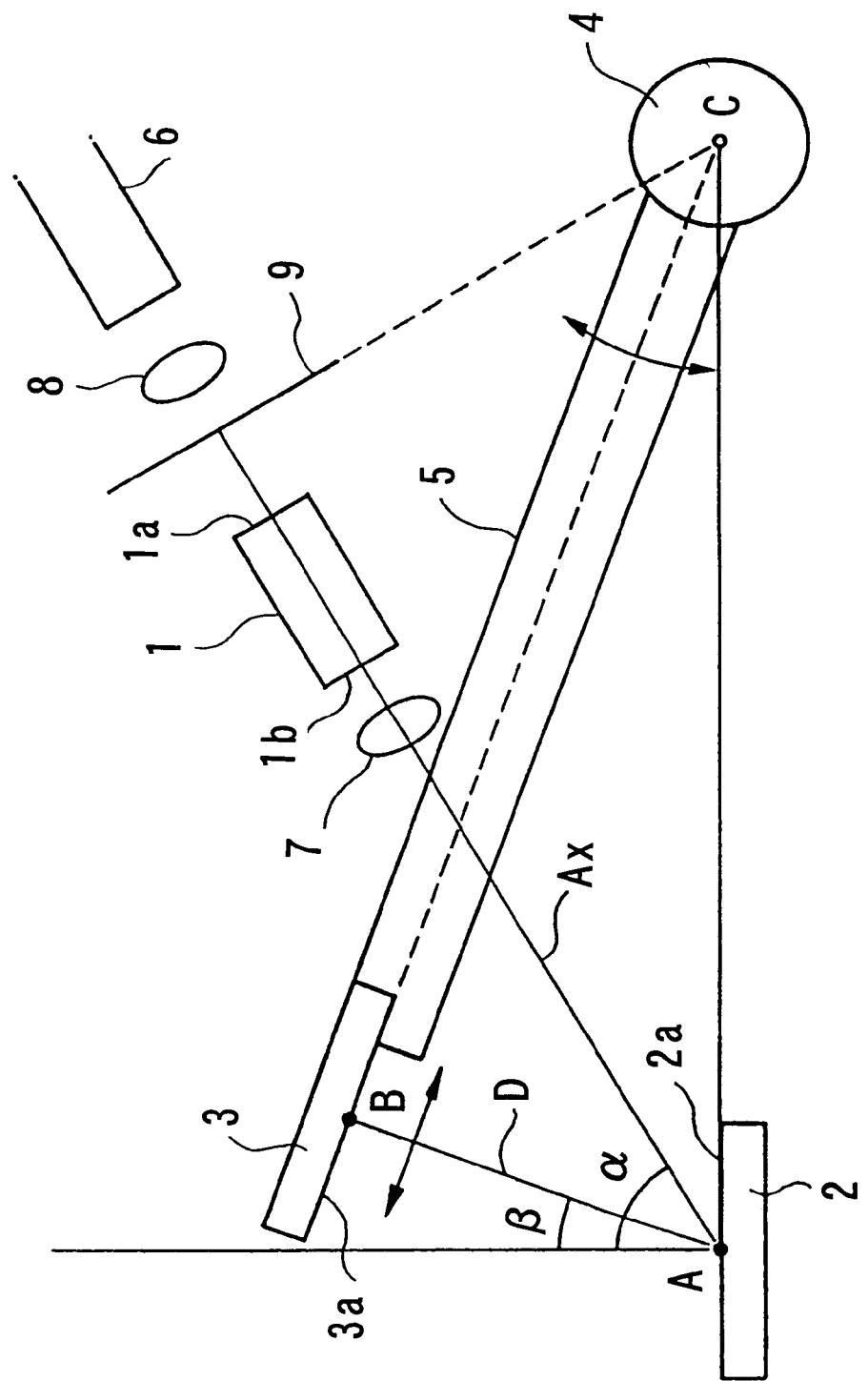
FIG. 5 is a diagram illustrating the conventional variable wavelength laser light source.
Figure 6:
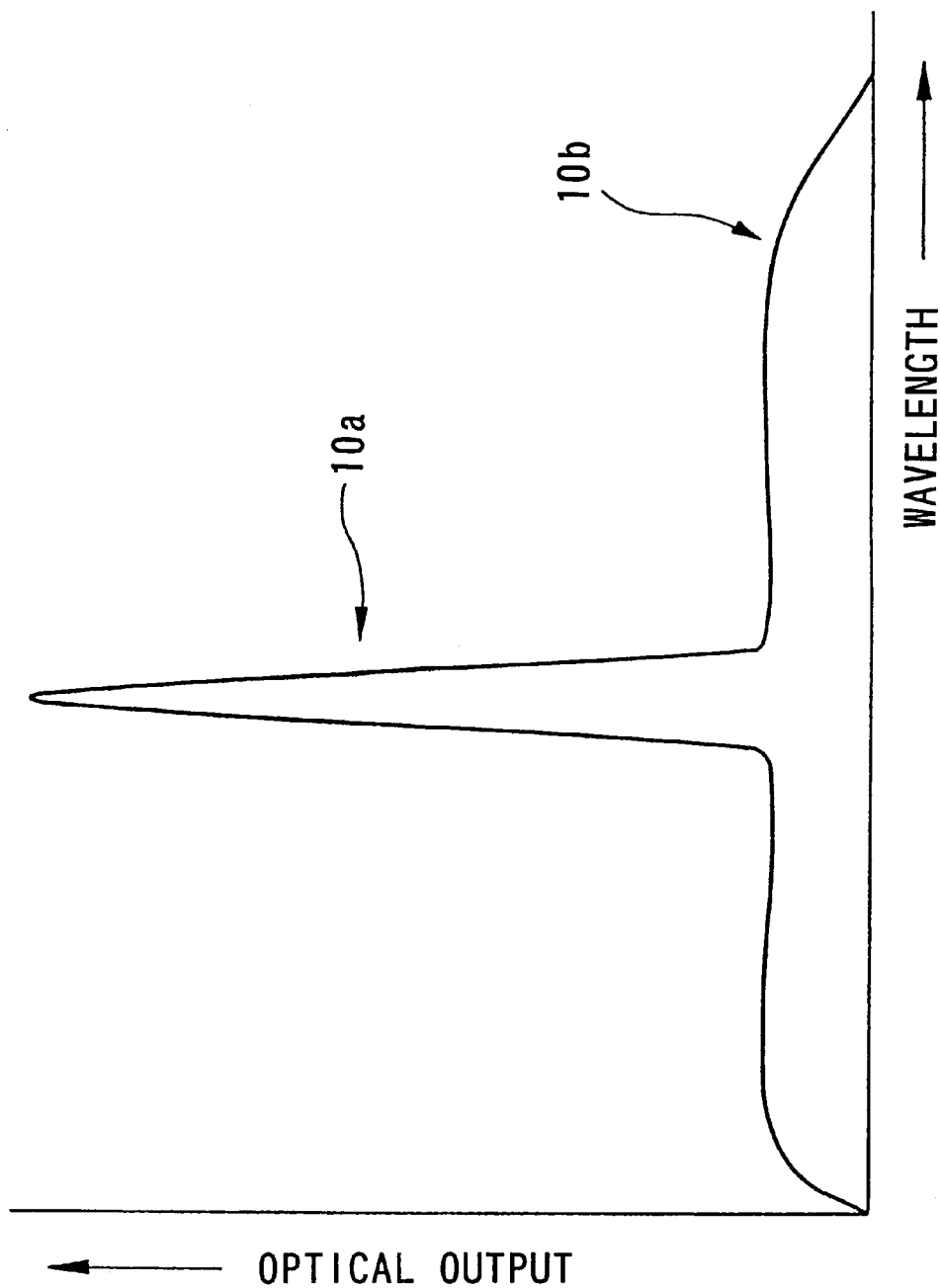
FIG. 6 is a graph showing a relation of the wavelength and the output of a conventional variable wavelength laser light source.

That is to say, the second optical reflecting means 14 rotates around the point I in the variable wavelength laser light source of the present embodiment, but a conventional variable wavelength laser light source rotates the total reflection mirror 3 around the point C as shown in FIG. 5. The present embodiment has the merit that the rotating accuracy of the second optical reflection means 14 need be only half that of a conventional total reflection mirror 3, under the condition that the resolution of the wavelength of the variable wavelength laser light source in the present embodiment is to be the same as a conventional one.

Figure 2:
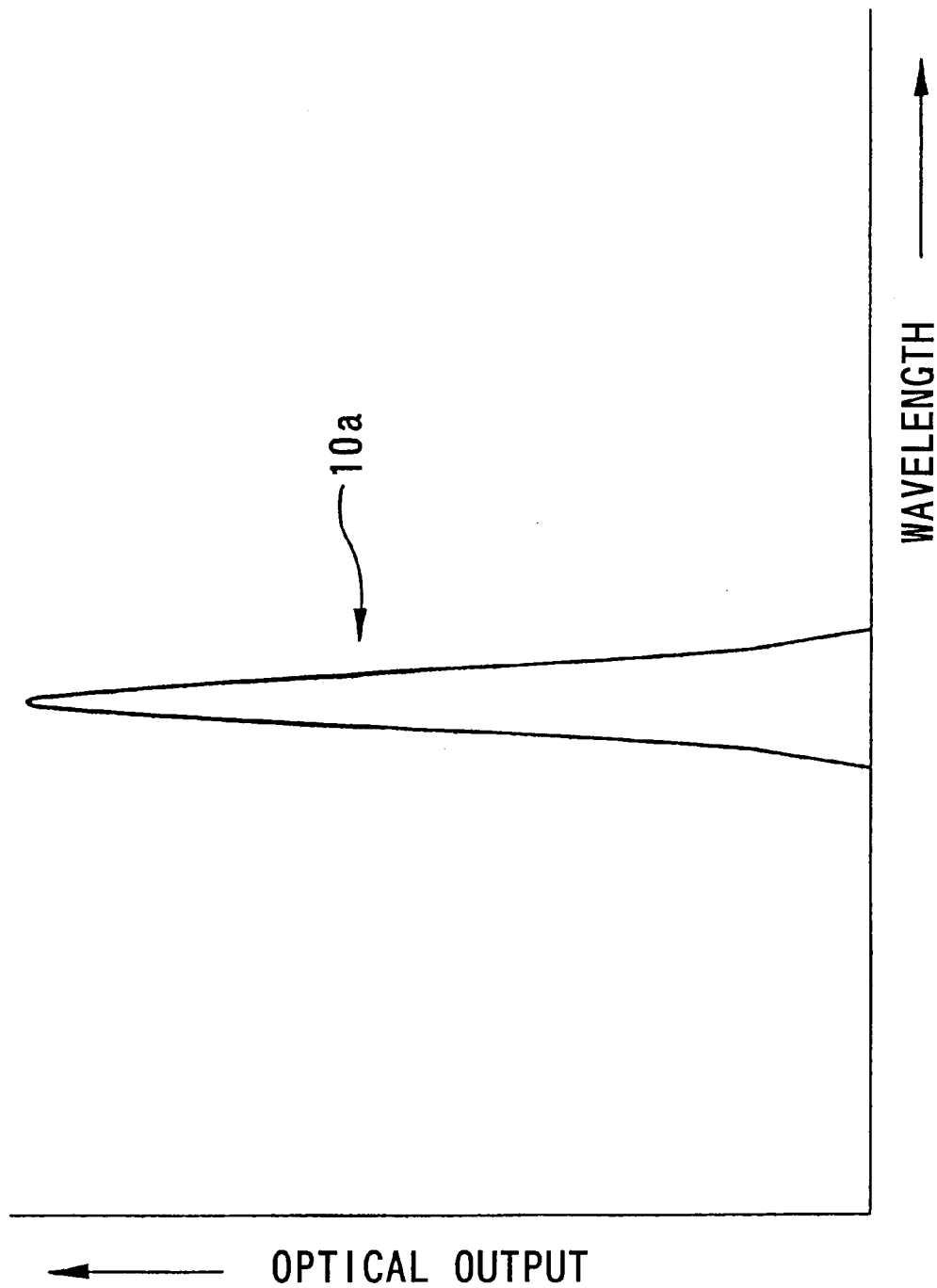
FIG. 2 is a graph showing the relation of the wavelength and the output of the variable wavelength laser light source according to the first embodiment of the present invention.

Furthermore, the relative position of the point J, which is the intersection of the optical axis of the laser light, and the second optical reflection means 14, is stable on the second optical reflecting means 14, when the position of the optical reflection means 14 is changed about the point I in order to change the wavelength λ. Consequently, as the optical connecting means 19 is provided at the backside of the second optical reflecting means 14 in order to input the light to the optical transmission line 18, the outgoing light from the wavelength selection element 13 can be used as the optical signal. This means that pure laser light 10a without spontaneously emitted light can be extracted as an optical signal, as shown in the FIG. 2.

As explained above, in the variable wavelength laser light source of the present embodiment, the resolution of the wavelength can be equivalent to the conventional one, even if the rotating accuracy of the second optical reflecting means 14 for changing the wavelength is half that of the a conventional total reflection mirror. Also, a variable wavelength laser light source can be provided which emits the pure laser light 10a without spontaneously emitted light.

B. Second Embodiment

Figure 3:
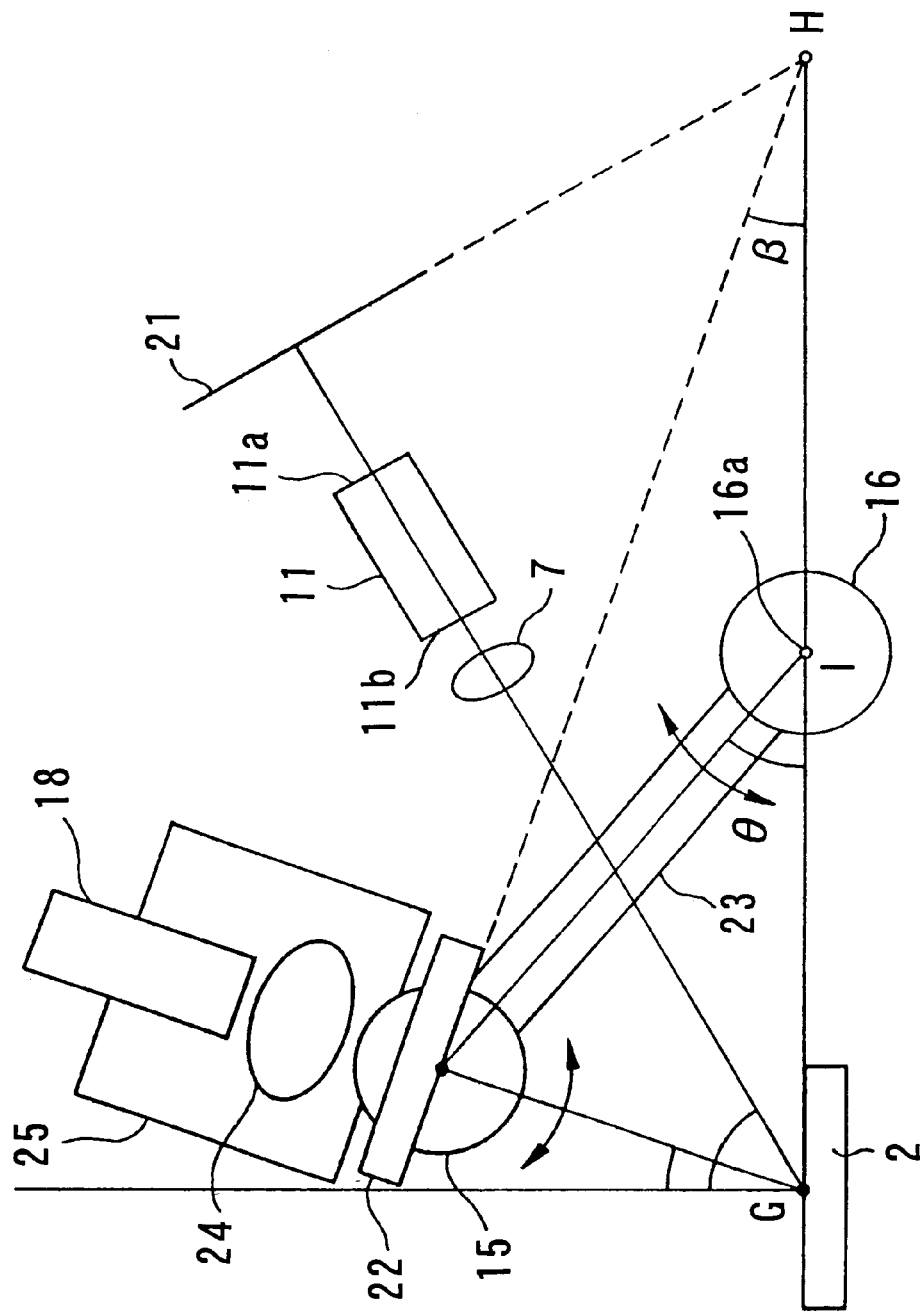
FIG. 3 is a diagram illustrating the variable wavelength laser light source according to the second embodiment of the present invention.

A variable wavelength laser light source according to a second embodiment of the present invention will be described with reference to FIG. 3 which is a diagram illustrating the variable wavelength laser light source according to the second embodiment of the present invention. In FIG. 3, the explanations of the components which have same reference numbers as in the FIG. 1 are omitted. There is a virtual reflecting surface 21 at a position of one side of the end surface 11a of the optical amplification element 11; which is a position of the first reflecting surface (first optical reflecting means) when the refractive index of the optical amplification element 11 is converted to 1. The end surface 11a is substituted for the first reflecting surface in this embodiment.

Reference number 22 is a second reflecting surface (second optical reflecting means), and reference number 23 is a supporting bar (connecting means) mechanically connecting the first rotating mechanism 15 and the second rotating mechanism 16. Reference number 24 is a lens (optical connecting means), and reference number 25 is a supporting bed (supporting means).

The supporting bed 25 is set on the first rotating mechanism 15. The second reflecting surface 22, the lens 24, and optical transmission line 18 are set on the supporting bed 25. The lens 24 and the optical transmission line 18 are arranged so as that the light passes perpendicularly through the second reflecting surface 22 to the optical transmission line 18 after being condensed by the lens 24.

A semiconductor laser is preferred as the optical amplification element 11, on which a high reflective film is coated on the end surface 11a, and an antireflection film is coated on the end surface 11b.

Also, a diffraction grating with less than 900 grooves per 1 millimeter is preferred as the diffraction grating 2, and a reflecting mirror with a reflectance of under 50% is preferred as the second reflecting surface 22.

Furthermore, either of an optical fiber or an optical waveguide is preferred as the optical transmission line 18.

In this embodiment, light which is output from the end surface 11b is converted to parallel light by the lens 7; and afterward laser oscillation is performed by both the optical resonator which is constituted by the end surface 11a and the second reflecting surface 22, and the optical amplification element 11. The wavelength of the laser oscillation depends on both the incident angle to the diffraction grating 2 of the laser light emitted by the optical amplification element 11 and the outgoing angle to the diffraction grating 2 of the laser light which is perpendicularly input to the second reflecting surface 22.

The second reflecting surface 22 is controlled by the first rotating mechanism 15 so that a line extended along the second reflecting surface 22 always passes the point H when the first rotating mechanism 15 rotates around the point I by rotating the second rotating mechanism 16 around the rotating axis 16a.

Also in the second embodiment, as in the first embodiment described above, the resolution of the wavelength can be equivalent same to that of the conventional device even if the rotating accuracy of the second reflecting surface 22 is half the rotating accuracy of the conventional total reflection mirror when changing the wavelength. Furthermore, a variable wavelength laser light source can be provided which emits pure laser light without spontaneously emitted light.

C. Third Embodiment

Figure 4:
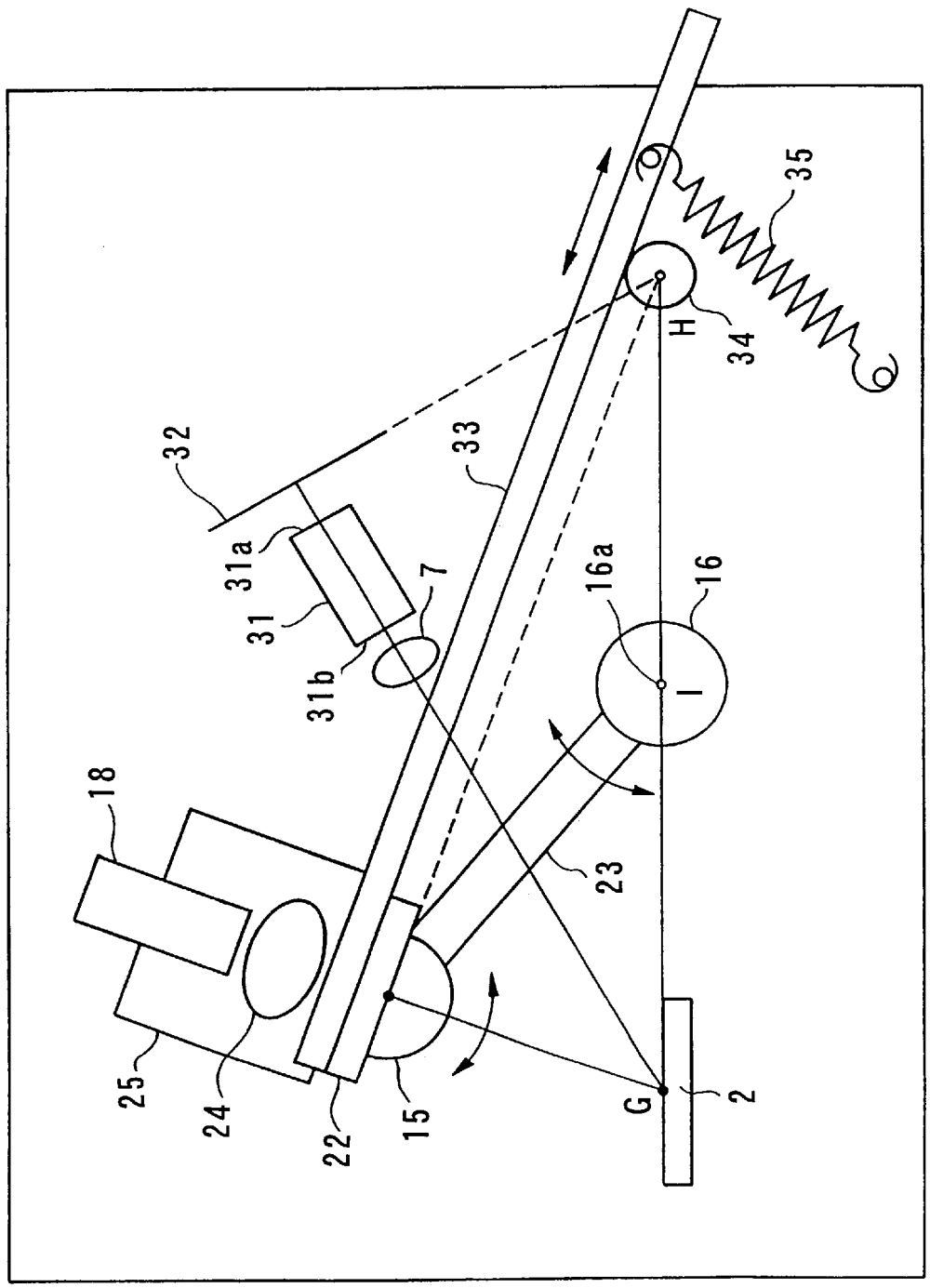
FIG. 4 is a diagram illustrating the variable wavelength laser light source according to the third embodiment of the present invention.

A variable wavelength laser light source according to a third embodiment of the present invention will be described with reference to FIG. 4 which is a diagram illustrating the variable wavelength laser light source according to the third embodiment of the present invention. In FIG. 4, the explanations of the components which have same reference numbers as in FIG. 1 and FIG. 3 are omitted. In FIG. 4, reference number 32 is a virtual reflecting surface which position is determined as a refraction index of a semiconductor laser (optical amplification element) 31 being converted to 1. The face 31a is used as a first reflecting surface.

Reference number 33 is a long guiding bar (guiding member) mounted on the reverse side of the second reflecting surface 22. Reference number 34 is a guide (supporting member) which supports the guiding bar 33 longitudinally and movably at the intersection point of the extension of the second reflecting surface 22 and the extension of the diffraction face (outgoing face) of the diffraction grating 2. Reference number 35 is a spring (elastic member) one end of which is connected to the guiding bar 33 and which maintains pressure on the guiding bar 33.

A semiconductor laser of which one face is coated with a high reflection coating and the other face is coated with an antireflection coating is preferred in the embodiment.

In this embodiment, light emitted from the surface 31a is made parallel by the lens 7, and laser oscillation is performed by both of the optical resonator constituted by the surface 31b, second reflecting surface 22, and the semiconductor laser 31. The wavelength of the laser oscillation depends on both the incident angle to the diffraction grating 2 of the laser light emitted by the semiconductor laser 31 and the outgoing angle to the diffraction grating 2 of the laser light which is perpendicularly input to the second reflecting surface 22.

The second reflecting surface 22 is controlled by the first rotating mechanism 15 with using the guiding bar 33, the guide 34 and the spring 34 so that a line extended along the second reflecting surface 22 always passes the point H when the first rotating mechanism 15 rotates around the point I by rotating the second rotating mechanism 16 around the rotating axis 16a.

Also in the third embodiment, as in the first and second embodiments described above, the resolution of the wavelength can be maintained equivalent to that of a conventional device even if the rotating accuracy of the second reflecting surface 22 is half the rotating accuracy of the conventional total reflection mirror, when changing the wavelength. Furthermore, a variable wavelength laser light source can be provided which emits the pure laser light without spontaneously emitted light.

Furthermore, the embodiments of the light sources of laser with variable wavelength shown above are only examples, and the present invention is not restricted by these embodiments.

What is claimed is:

1. A variable wavelength laser light source comprising:
   a laser for producing light and having first and second faces for light output;
   a first optical reflector located to one side of one output face of said laser and having a reflecting surface to receive light;
   a diffraction grating located to one side of the other face of said laser to select and output at a selected wavelength light received from said other face of said laser;
   a second optical reflector which receives and reflects the light outputted from said diffraction grating, said second optical reflector forming an optical resonator with said laser and said first optical reflector;

a first rotating mechanism to which said second optical reflector is mounted which rotates said second optical reflector around an axis of said first rotating mechanism; and a second rotating mechanism which rotates said second optical reflector around a second axis located remotely of said second optical reflector.

2. A variable wavelength laser light source according to claim 1 further comprising a mechanism connecting said first rotating mechanism and said second rotating mechanism whereby rotation of said second rotating mechanism rotates said first rotating mechanism and said second optical reflector.

3. A variable wavelength laser light source according to claim 1, wherein said second optical reflector has low optical reflectance and also is capable of transmitting light from a first face receiving light to a second face on the opposite side from which the light is outputted.

4. A variable wavelength laser light source according to claim 3, further comprising an optical connecting means at said second face of said second optical reflector to input the light transmitted through said second optical reflector to an optical transmission line.

5. A variable wavelength laser light source according to claim 4, further comprising a supporting means on said first rotating mechanism which supports said second optical reflector, said optical connecting means and said optical transmission line.

6. A variable wavelength laser light source according to claim 1, wherein said second axis is located between said diffraction grating and the intersection of a line extended along the reflecting surface of said first optical reflector and a line extended along the surface of said diffraction grating that receives the light from said other face of said laser.

7. A variable wavelength laser light source according to claim 1, wherein a line extended along the reflecting surface of said second optical reflector passes the intersection of a line extended along the reflecting surface of said first optical reflector and a line extended along the surface of said diffraction grating that receives light from said other face of said laser.

8. A variable wavelength laser light source according to claim 1, further comprising:

a guiding member mounted to said second optical reflector;

a supporting member located at the intersection of a line extended along the reflecting surface of said first optical reflector and a line extended along the surface of diffraction grating that receives light from said other face of said laser and supports said guiding member movably; and an elastic member connected to said guiding member and pushes said guiding member onto said supporting member.

* * * * *